US008093601B2

(12) United States Patent
Miyamoto et al.

(10) Patent No.: US 8,093,601 B2
(45) Date of Patent: Jan. 10, 2012

(54) ACTIVE MATRIX SUBSTRATE

(75) Inventors: Tadayoshi Miyamoto, Nara (JP);
Mitsuhiro Tanaka, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 493 days.

(21) Appl. No.: 12/442,870

(22) PCT Filed: Sep. 25, 2007

(86) PCT No.: PCT/JP2007/068580
§ 371 (c)(1),
(2), (4) Date: Mar. 25, 2009

(87) PCT Pub. No.: WO2008/038635
PCT Pub. Date: Apr. 3, 2008

(65) Prior Publication Data
US 2010/0072493 A1    Mar. 25, 2010

(30) Foreign Application Priority Data

Sep. 26, 2006  (JP) ................................ 2006-261409

(51) Int. Cl.
*H01L 31/00* (2006.01)
*H01L 29/04* (2006.01)
(52) U.S. Cl. ............. 257/88; 257/59; 257/72; 257/365; 257/E29.117; 349/139; 349/143; 349/149; 349/151
(58) Field of Classification Search ................ 257/4, 40, 257/59, 72, 57, 52, 288, 365, E29.111–E29.112, 257/E29.116–E29.118; 349/33, 41, 42, 139, 349/143, 149, 151, 74
See application file for complete search history.

(56) References Cited

U.S. PATENT DOCUMENTS

| 5,744,820 | A | 4/1998 | Matsushima et al. |
| 6,028,580 | A * | 2/2000 | Kosegawa et al. ............... 345/98 |
| 6,538,708 | B2 | 3/2003 | Zhang |
| 2001/0029069 | A1* | 10/2001 | Yamazaki et al. ............ 438/149 |
| 2004/0196240 | A1 | 10/2004 | Koyama et al. |

FOREIGN PATENT DOCUMENTS

| EP | 1 213 763 A2 | 6/2002 |
| JP | 8-213628 A | 8/1996 |
| JP | 08213628 A * | 8/1996 |
| JP | 8-262486 A | 10/1996 |
| JP | 9-97909 A | 4/1997 |
| JP | 2000-147556 A | 5/2000 |
| JP | 2000-150904 A | 5/2000 |
| JP | 2000-338919 A | 12/2000 |
| JP | 2003-29299 A | 1/2003 |

* cited by examiner

*Primary Examiner* — A. Sefer
*Assistant Examiner* — Ermias Woldegeorgis
(74) *Attorney, Agent, or Firm* — Birch, Stewart, Kolasch & Birch, LLP (57) ABSTRACT

In an active matrix substrate (100) of the present invention, a gate bus line (105) and a gate electrode (166) extend in the first direction (the x direction). At a contact portion (168) for electrically connecting the gate bus line (105) with the drain regions of a first-conductivity-type transistor section (162) and a second-conductivity-type transistor section (164), the direction of the straight line (L1) of the shortest distance (d1) between one of a plurality of first-conductivity-type drain connecting portions (168c) that is closest to the gate bus line (105) and the gate bus line (105) is inclined with respect to the second direction (the y direction).

15 Claims, 8 Drawing Sheets

FIG.1 y DIRECTION
x DIRECTION

ACTIVE MATRIX SUBSTRATE

TECHNICAL FIELD

The present invention relates to an active matrix substrate.

BACKGROUND ART

Active matrix substrates in which pixel electrodes are arranged in a matrix pattern are used in display devices, such as liquid crystal display devices. Liquid crystal display devices are used not only as large-size televisions, but also as small-size display devices such as display sections of portable telephones. When active matrix substrates are used as small-size display devices, those including drivers therein are used desirably.

Figure 6:
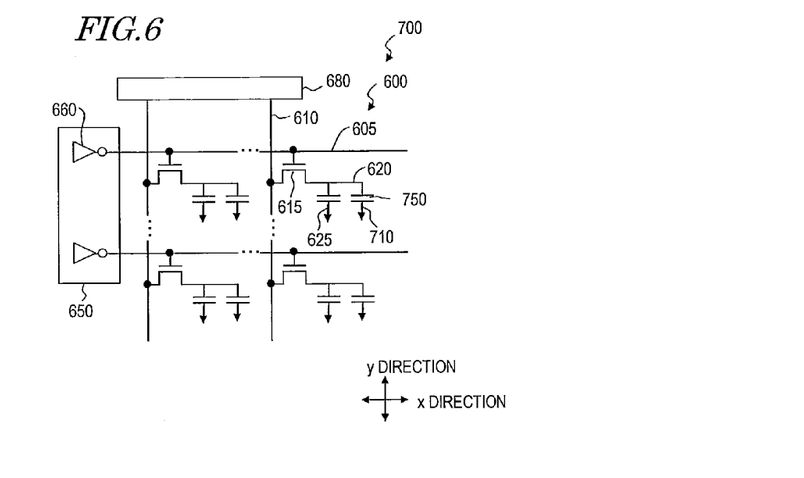
FIG. 6 An equivalent circuit diagram of a display device using a conventional active matrix substrate.

FIG. 6 shows an equivalent circuit diagram of a liquid crystal display device 700 using a conventional active matrix substrate 600. As shown in FIG. 6, the active matrix substrate 600 includes a TFT (Thin Film Transistor) 615 provided for each pixel electrode 620, with the gate of the TFT 615 being connected to a gate bus line 605 extending in the row direction, and the source region of the TFT 615 to a source bus line 610 extending in the column direction. A gate driver 650 and a source driver 680 are provided in the peripheral region of the active matrix substrate 600, wherein the gate driver 650 applies a scanning signal voltage to the gate bus line 605, and the source driver 680 applies a data signal voltage to the source bus line 610. The gate driver 650 includes a buffer inverter 660 provided for each row of pixels.

Figure 7:
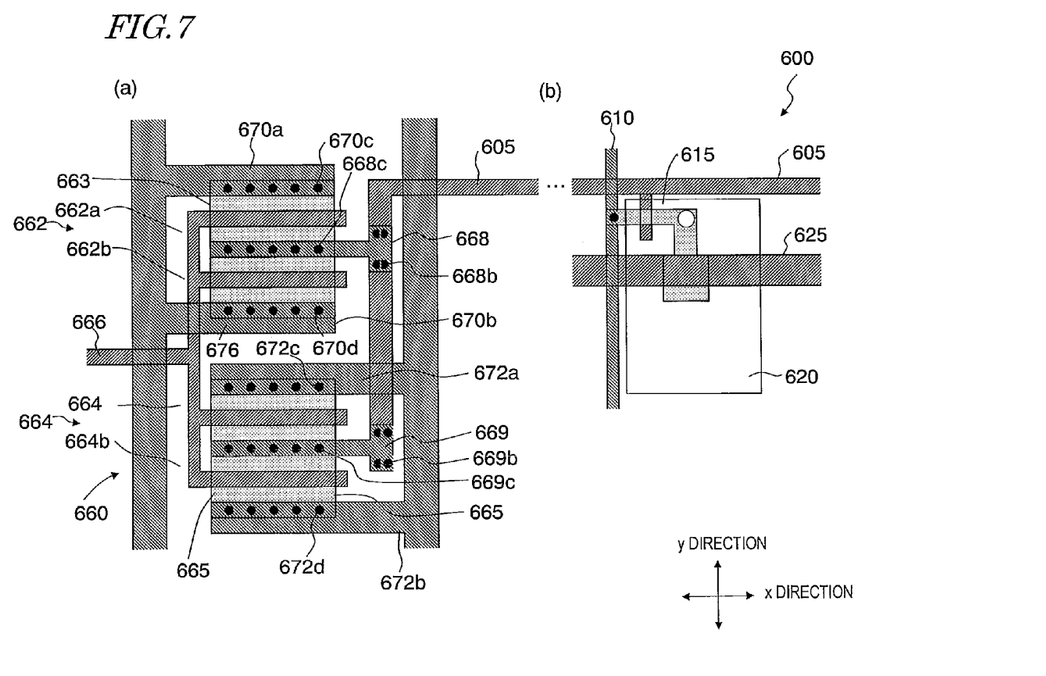
FIG. 7 A schematic diagram illustrating a conventional active matrix substrate, wherein (a) shows a plan view of the peripheral region, and (b) shows a plan view of the display region.

Referring now to FIG. 7, the configuration of the conventional active matrix substrate 600 will be described. FIG. 7(a) shows a schematic plan view of the buffer inverter 660 and the vicinity thereof in the peripheral region, and FIG. 7(b) shows a schematic plan view of the pixel electrode 620 and the vicinity thereof in the display region.

As shown in FIG. 7(a), the buffer inverter 660 includes a Pch transistor section 662, and an Nch transistor section 664. A Pch transistor section 662 includes two PMOS (P-channel Metal-Oxide Semiconductor) transistors 662a and 662b, and the Nch transistor section 664 includes two NMOS (N-channel Metal-Oxide Semiconductor) transistors 664a and 664b. The transistor sections 662 and 664 each include two transistors as described above, thus increasing the driving power (output capacity). In the buffer inverter 660, transistors of the same conductivity type are arranged in the column direction (the y direction), sharing a drain region.

In the active matrix substrate 600, the gate bus line 605 extends in the row direction (the x direction) in the display region but is bent perpendicularly (in the column direction) in the vicinity of the buffer inverter 660. The source bus line 610 extends in the column direction (the y direction).

A contact portion 668 electrically connects the drain region of the transistors 662a and 662b with a region of a portion of the gate bus line 605 that is extending in the column direction, and a contact portion 669 electrically connects the drain region of the transistors 664a and 664b with another region of the portion of the gate bus line 605 that is extending in the column direction. As described above, the drain region of the transistors 662a and 662b and the drain region of the transistors 664a and 664b are electrically connected to the gate bus line 605 via the contact portions 668 and 669.

Contact portions 670a and 670b electrically connect the source regions of the transistors 662a and 662b with the high-voltage power supply, and contact portions 672a and 672b electrically connect the source regions of the transistors 664a and 664b with the low-voltage power supply. The Pch transistor section 662 and the Nch transistor section 664 described above together form a CMOS to be a buffer inverter.

As can be seen from FIG. 7, in the active matrix substrate 600, the contact portions 668 and 669 each connect a semiconductor layer 663 or 665, respectively, with the gate bus line 605 via a plurality of connecting portions 668b, 668c, 669b and 669c separated from one another. The contact portions 670a, 670b, 672a and 672b are in contact with the semiconductor layers 663 and 665 via a plurality of connecting portions 670c, 670d, 672c and 672d, respectively, separated from one another. By thus connecting two members together via a plurality of connecting portions, connection failure is suppressed even when the connection is insufficient at one connecting portion.

With active matrix substrates, there have been demands for realizing narrower bezels, and there have also been demands for placing existing components within a smaller area in the peripheral region to so as make a space for placing a new circuit for improving the functionality. In recent years, small-size display devices with a limited display area have also been required to produce a higher-definition display, and the resolution thereof has been improved by reducing the pixel size. For example, while QVGA (resolution: 320×240) display devices have been used for display sections of portable telephones, VGA (resolution: 640×480) display devices whose resolution is four times higher have been put onto the market, and it is expected that the definition will be further increased in the future.

However, when transistors of the same conductivity type are arranged in the column direction (the y direction) as are in the active matrix substrate 600 shown in FIG. 7, it is not possible to realize a small width in the y direction of a buffer inverter provided for a row of pixels, thus failing to achieve a higher definition. In view of this, transistors of the same conductivity type may be arranged in the direction in which the gate electrode extends, as disclosed in Patent Document 1, in which case the width of the buffer inverter in the y direction can be reduced as compared with a case where transistors of the same conductivity type are arranged in the direction perpendicular to the direction in which the gate electrode extends.

Figure 8:
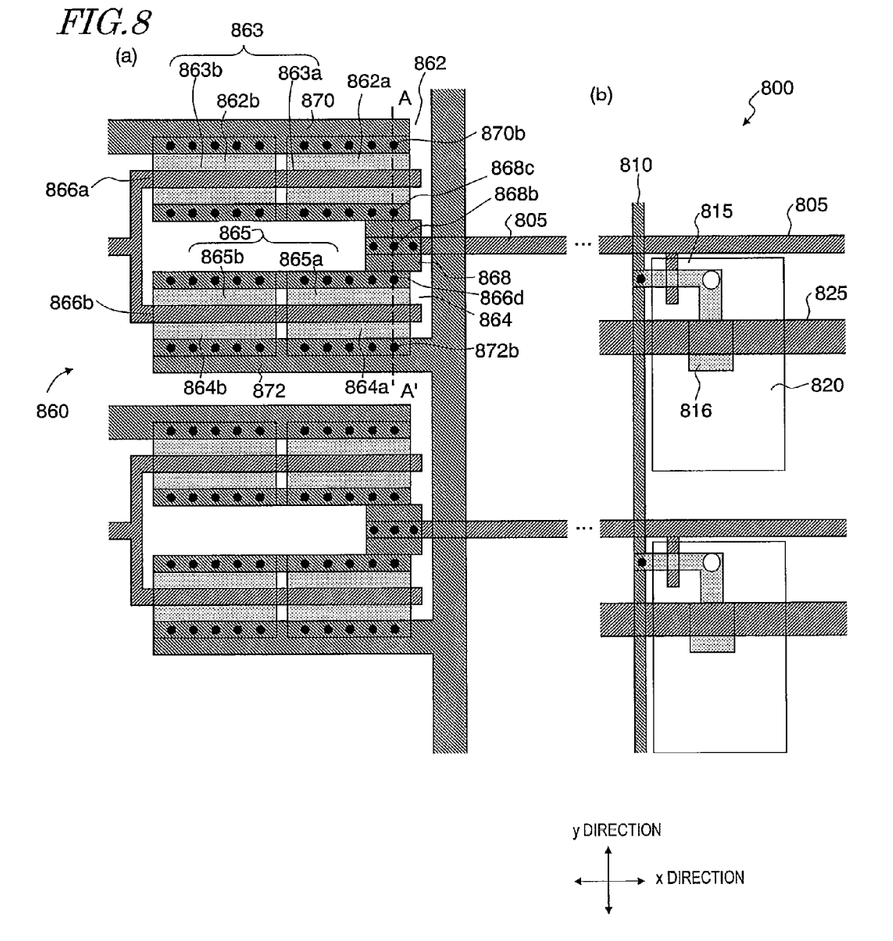
FIG. 8 A schematic diagram illustrating the configuration of another conventional active matrix substrate, wherein (a) shows a plan view of the peripheral region, and (b) shows a plan view of the display region.
Figure 9:
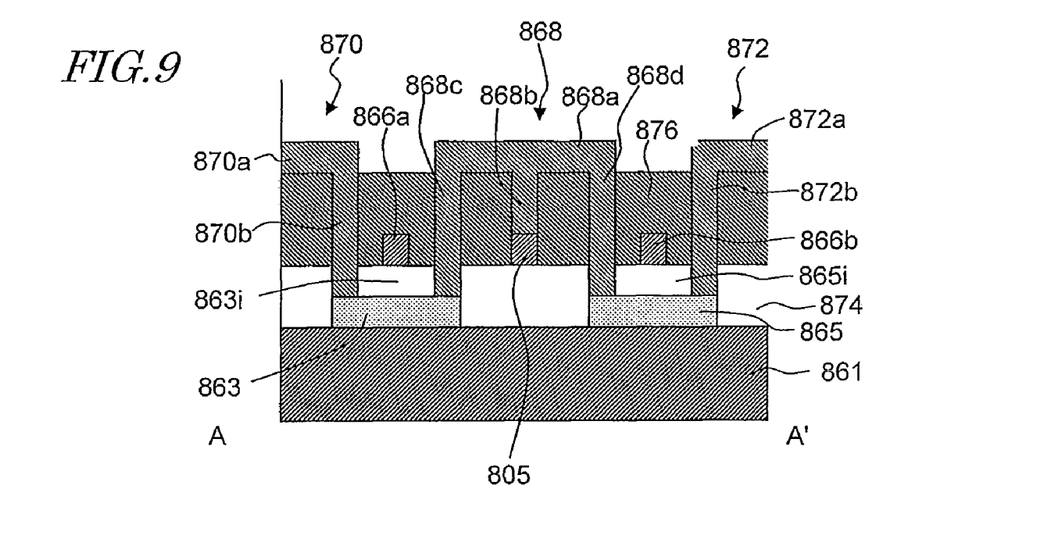
FIG. 9 A cross-sectional view taken along line A-A' in FIG. 8(a).

Referring now to FIGS. 8 and 9, the configuration of another conventional active matrix substrate 800 will be described. FIG. 8(a) shows a schematic plan view of a buffer inverter 860 and the vicinity thereof in the peripheral region, and FIG. 8(b) shows a schematic plan view of a pixel electrode 820 and the vicinity thereof in the display region. FIG. 9 shows a cross section taken along line A-A' in FIG. 8(a).

In the active matrix substrate 800, transistors of the same conductivity type are arranged in the row direction, thus increasing the gate width (the length in the x direction) and hence the driving power, and also reducing the width of the buffer inverter 860 in the column direction (the y direction) as compared with that of the buffer inverter 660 shown in FIG. 7(a). As described above, with a reduction in the width of the buffer inverter 860 in the column direction, it is possible to reduce the pixel size and to achieve a higher-definition display.

As shown in FIG. 9, a contact portion 868 includes a flat portion 868a provided on an interlayer film 876, gate bus line connecting portions 868b, Pch drain connecting portions 868c, and Nch drain connecting portions 868d. As does the contact portion 868, a contact portion 870 includes a flat portion 870a provided on the interlayer film 876 and Pch source connecting portions 870b, and a contact portion 872 includes a flat portion 872a provided on the interlayer film 876 and Nch source connecting portions 872b. The connecting portions 868b, 868c, 868d, 870b and 872b are provided in contact holes formed in an insulating layer 874 and the interlayer film 876.

The active matrix substrate 800 is produced as follows.

First, a base coat film (not shown) is formed on an insulative substrate 861, and an amorphous silicon layer is formed thereon. The amorphous silicon layer is crystallized by laser annealing, or the like. Then, the silicon layer is patterned. Thus, island-like semiconductor layers 863 and 865 are produced. Then, a silicon oxide layer is deposited, thus forming the insulating layer 874 including gate insulating films 863i and 865i.

Then, tantalum, tungsten, or the like, is deposited on the insulating layer 874 by a sputtering method, or the like, and is patterned. The patterning is done by dry etching for the purpose of miniaturization. By this patterning, a gate bus line 805, a storage capacitor line 825 and gate electrodes 866a and 866b are formed. As described above, the gate bus line 805, the storage capacitor line 825 and the gate electrodes 866a and 866b are produced in the same step. The layer forming the gate bus line 805, the storage capacitor line 825 and the gate electrodes 866a and 866b as described above will be referred to as a gate electrode layer.

Then, the semiconductor layers 863 and 865 are implanted with ions using the gate electrodes 866a and 866b as a mask, followed by an annealing for activation, thus forming a TFT 815. Then, silicon oxide, or the like, is deposited, and contact holes are formed therein by patterning, thus forming the interlayer film 876.

Then, aluminum, or the like, is deposited in the contact holes in the interlayer film 876 and on the interlayer film 876, and is patterned. By this patterning, a source bus line 810 and the contact portions 868, 870 and 872 are produced.

Then, silicon oxide, an organic insulating film, or the like, is deposited and patterned to form contact holes, thus forming an interlayer film (not shown) in the display region, and the pixel electrode 820 is formed on the interlayer film using ITO, or the like. The active matrix substrate 800 is produced as described above.

[Patent Document 1] Japanese Laid-Open Patent Publication No. 9-97909

DISCLOSURE OF INVENTION

Problems to be Solved by the Invention

When one attempts to increase the definition of display as with the active matrix substrate 800, however, a portion of the buffer inverter 860 is broken by an ESD (Electrostatic Discharge) to increase the occurrence of a line defect, thus lowering the production yield.

Figure 10:
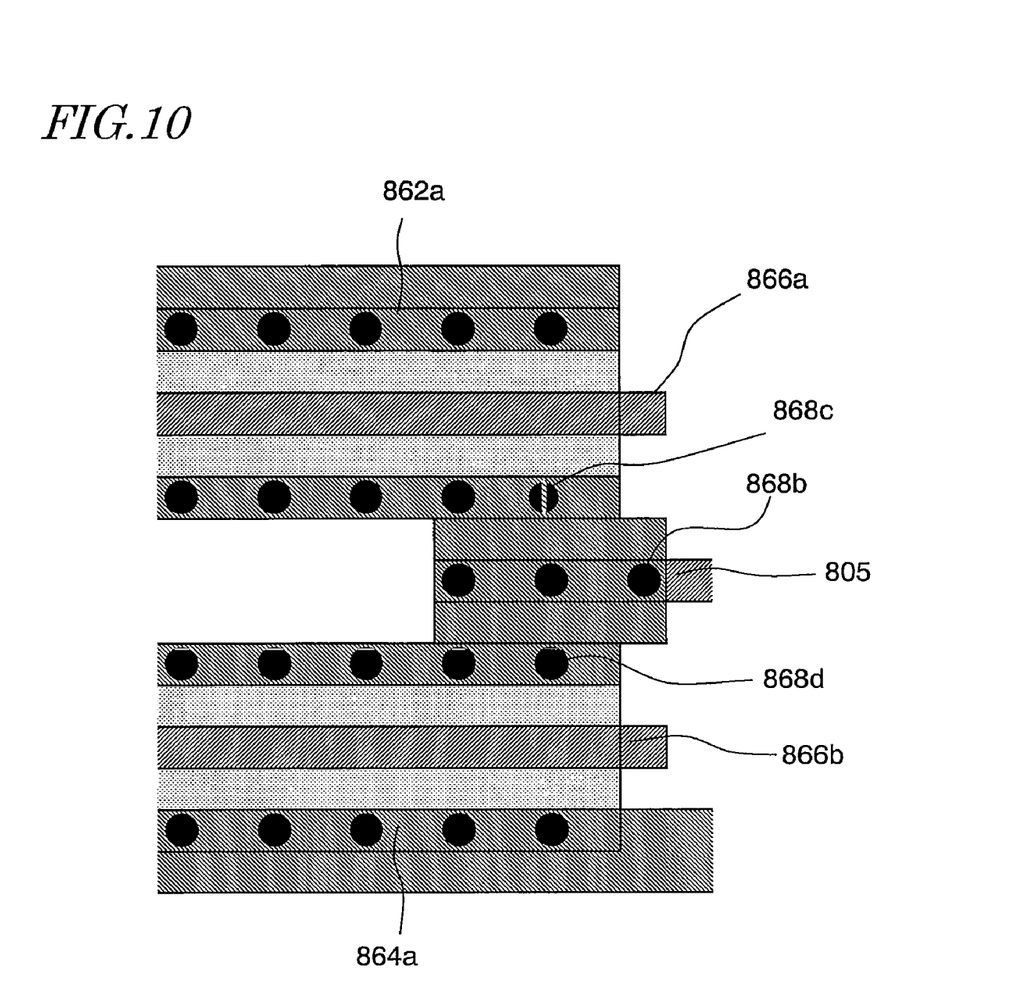
FIG. 10 A plan view of a buffer inverter and the vicinity thereof in the active matrix substrate shown in FIG. 8 where an electrostatic breaking has occurred.

FIG. 10 shows a schematic diagram of the buffer inverter 860 and the vicinity thereof in the active matrix substrate 800 where a line defect has occurred. As shown in FIG. 10, there is a crack at and around a contact hole located between the gate bus line 805 and the gate electrode 866a, which breaks the gate insulating film, thus causing the line defect. The occurrence of such a line defect can be detected by electrically measuring a leak. Alternatively, a crack itself can be detected by analyzing the structure using a cross-sectional SEM (Scanning Electron Microscope) image or a TEM (Transmission Electron Microscope) image.

The gate bus line 805 is a long wire, and a large amount of charge can be stored in the gate bus line 805. While the ion implantation into the semiconductor layers 863 and 865 is performed using the gate electrodes 866a and 866b as a mask as described above, a charge is stored during the ion implantation in the gate bus line 805, which is produced in the same step with the gate electrodes 866a and 866b. Moreover, while the patterning of the gate electrode layer is performed minutely by dry etching, a charge is likely to be stored in the gate bus line 805 during this process.

The charge thus stored in the gate bus line 805 may leak during the formation of contact holes in the interlayer film 876. Particularly, in the active matrix substrate 800, the pixel size is reduced in order to increase the definition of display, thus accordingly reducing the distance between the gate electrodes 866a and 866b and the gate bus line 805 and the distance between the drain connecting portions 868c and 868d of the contact portion 868 and the gate bus line 805. Contact holes for the drain connecting portions 868c and 868d are formed in the interlayer film 876 before the contact portion 868 is produced. If the distance between the contact holes and the gate bus line 805 is short, the charge stored in the gate bus line 805 is discharged to the gate electrodes 866a and 866b via the contact holes. When there is such an electrostatic discharge, a crack occurs at and around a contact hole, which breaks the gate insulating film. A line defect occurs as a result of such an electrostatic breaking by an electrostatic discharge.

There are known techniques in the art for suppressing such an electrostatic breaking by an electrostatic discharge. However, it is not preferred to employ these techniques for active matrix substrates used in display devices for the following reasons.

Specifically, there is a known technique in the art for reducing the amount of charge stored in a wire by reducing the length of the wire (see Japanese Laid-Open Patent Publication No. 8-262486). In this technique, two wire portions separated from each other by a separating portion are connected to each other via a wire connecting portion, which is formed from a different wiring layer, thus forming a gate bus line. Thus, the technique reduces the amount of charge to be stored in the wire portions during the production process of the active matrix substrate, thereby suppressing the electrostatic breaking. With this technique, however, the area of the pixel electrode is reduced by the provision of the wire connecting portion, thus decreasing the pixel aperture ratio and lowering the display quality.

There is also a known technique in the art for suppressing the occurrence of an electrostatic discharge by neutralizing the static electricity stored in the gate bus line (see, for example, Japanese Laid-Open Patent Publication No. 2000-147556). In this technique, an antenna TFT is provided, electrically connected to the gate bus line, and the charge stored in the gate bus line therefore leaks to the antenna TFT to be neutralized in an impurity semiconductor layer of the antenna TFT, thus suppressing the occurrence of an electrostatic discharge. However, as stated in this publication, the production of an antenna TFT requires an area that is several tens of times larger than a pixel TFT, and it is not possible with this technique to realize narrower bezels of active matrix substrates or to place a new circuit for a higher degree of integration, thus hindering the improvement in the functionality of display devices. Therefore, it is not possible with these techniques to desirably produce an active matrix substrate.

The present invention has been made in view of the above problems, and an objective thereof is to provide an active matrix substrate suitable for the production of a display device in which the definition of display is improved and the occurrence of a line defect is desirably suppressed.

Means for Solving the Problems

An active matrix substrate of the present invention includes: a gate bus line; a buffer inverter including a firstconductivity-type transistor section and a second-conductivity-type transistor section, wherein each of the first-conductivity-type transistor section and the second-conductivity-type transistor section includes a semiconductor layer and a gate electrode, the semiconductor layer including a source region, a drain region and a channel region; an interlayer film covering the gate bus line and the gate electrode; and a contact portion for electrically connecting the drain regions of the first-conductivity-type transistor section and the second-conductivity-type transistor section with the gate bus line, wherein the gate bus line and the gate electrode extend in a first direction, the first-conductivity-type transistor section includes a plurality of first-conductivity-type transistors arranged in the first direction, the second-conductivity-type transistor section includes a plurality of second-conductivity-type transistors arranged in the first direction, the contact portion includes a flat portion provided on the interlayer film, a plurality of gate bus line connecting portions each electrically connecting the flat portion with the gate bus line, a plurality of first-conductivity-type drain connecting portions each electrically connecting the flat portion with the drain region of the first-conductivity-type transistor section, and a plurality of second-conductivity-type drain connecting portions each electrically connecting the flat portion with the drain region of the second-conductivity-type transistor section, and a direction of a straight line denoting a shortest distance between one of the plurality of first-conductivity-type drain connecting portions that is closest to the gate bus line and the gate bus line is inclined with respect to a second direction perpendicular to the first direction.

In one embodiment, the active matrix substrate further includes: an insulating layer including a gate insulating film provided between the channel region of the semiconductor layer and the gate electrode, wherein the gate bus line and the gate electrode are provided on the insulating layer.

In one embodiment, the plurality of gate bus line connecting portions are provided in a plurality of contact holes formed in the interlayer film; and the plurality of first-conductivity-type drain connecting portions are provided in a plurality of contact holes formed in the interlayer film and the insulating layer.

In one embodiment, a shortest distance between one of the plurality of first-conductivity-type drain connecting portions that is closest to the gate bus line and the gate bus line is 7 μm.

In one embodiment, a direction of a straight line denoting a shortest distance between one of the plurality of second-conductivity-type drain connecting portions that is closest to the gate bus line and the gate bus line is inclined with respect to the second direction.

In one embodiment, the active matrix substrate further includes: a first source contact portion in contact with the source region of the first-conductivity-type transistor section; and a second source contact portion in contact with the source region of the second-conductivity-type transistor section.

In one embodiment, the first source contact portion and the second source contact portion are produced from a same material as the contact portion.

In one embodiment, the first source contact portion includes a flat portion provided on the interlayer film, and a plurality of first-conductivity-type source connecting portions each electrically connecting the flat portion with the source region of the first-conductivity-type transistor section.

In one embodiment, the plurality of first-conductivity-type drain connecting portions and the plurality of first-conductivity-type source connecting portions are provided symmetrically with each other with respect to a gate electrode of the first-conductivity-type transistor.

In one embodiment, a direction of a straight line denoting a shortest distance between the gate electrode and the gate bus line is the second direction.

In one embodiment, the plurality of first-conductivity-type drain connecting portions and the plurality of first-conductivity-type source connecting portions are provided asymmetrically with each other with respect to a gate electrode of the first-conductivity-type transistor.

In one embodiment, a direction of a straight line denoting a shortest distance between the gate electrode and the gate bus line is inclined with respect to the second direction.

A display device of the present invention includes: the active matrix substrate as set forth above; and a display medium layer provided on the active matrix substrate.

A method for manufacturing an active matrix substrate of the present invention includes the steps of: forming a semiconductor layer for a first-conductivity-type transistor section including a plurality of first-conductivity-type transistors arranged in a first direction and a semiconductor layer for a second-conductivity-type transistor section including a plurality of second-conductivity-type transistors arranged in the first direction, wherein the first-conductivity-type transistor section and the second-conductivity-type transistor section are included in a buffer inverter, and each of the semiconductor layers includes a source region, a channel region and a drain region; forming a gate bus line and a gate electrode of the first-conductivity-type transistor section and the second-conductivity-type transistor section, wherein the gate bus line and the gate electrode extend in the first direction; forming an interlayer film covering the gate bus line and the gate electrode; and forming a contact portion for electrically connecting the drain regions of the first-conductivity-type transistor section and the second-conductivity-type transistor section with the gate bus line, wherein the contact portion includes a flat portion provided on the interlayer film, a plurality of gate bus line connecting portions each electrically connecting the flat portion with the gate bus line, a plurality of first-conductivity-type drain connecting portions each electrically connecting the flat portion with the drain region of the first-conductivity-type transistor section, and a plurality of second-conductivity-type drain connecting portions each electrically connecting the flat portion with the drain region of the second-conductivity-type transistor section, wherein in the step of forming the contact portion, a direction of a straight line denoting a shortest distance between one of the plurality of first-conductivity-type drain connecting portions that is closest to the gate bus line and the gate bus line is inclined with respect to a second direction perpendicular to the first direction.

In one embodiment, the method further includes the step of: forming, in the interlayer film, a plurality of contact holes for the plurality of first-conductivity-type drain connecting portions, wherein in the step of forming the plurality of contact holes, a direction of a straight line denoting a shortest distance between one of the plurality of contact holes for the plurality of first-conductivity-type drain connecting portions that is closest to the gate bus line and the gate bus line is inclined with respect to the second direction.

Effects of the Invention

An active matrix substrate of the present invention is used suitably for the production of a display device in which the definition of display is improved and the occurrence of a line defect is desirably suppressed.

BRIEF DESCRIPTION OF DRAWINGS

FIG. 4 (a) shows a cross-sectional view taken along line A-A' in FIG. 3(a), and (b) shows a cross-sectional view taken along line B-B' in FIG. 3(b).

DESCRIPTION OF THE REFERENCE NUMERALS

100 Active matrix substrate
105 Gate bus line
110 Source bus line
110a Connecting portion
111 Connecting portion
115 TFT
116 Semiconductor layer
120 Pixel electrode
120a Connecting portion
125 Storage capacitor line
150 Gate driver
152 Shift register circuit
154 Level shifter circuit
156 Buffer circuit
160 Buffer inverter
161 Insulative substrate
162 Pch transistor section
162a, 162b PMOS transistor
163 Semiconductor layer
163i Gate insulating film
164 Nch transistor section
164a, 164b NMOS transistor
165 Semiconductor layer
165i Gate insulating film
166 Gate electrode
168 Contact portion
168a Flat portion
168b Gate bus connecting portion
168c Pch drain connecting portion
168d Nch drain connecting portion
170 First source contact portion
170a Flat portion
170b Pch source connecting portion
172 Second source contact portion
172a Flat portion
172b Nch source connecting portion
174 Insulating layer
176 First interlayer film
178 Second interlayer film
180 Source driver

BEST MODE FOR CARRYING OUT THE INVENTION

Embodiments of active matrix substrates and display devices using the same according to the present invention will now be described with reference to the drawings. While the following description is directed to a liquid crystal display device, being an example display device, the display device according to the present invention is not limited to this, but may be any display device using an active matrix substrate.

Embodiment 1

A first embodiment of an active matrix substrate according to the present invention will now be described.

Figure 1:
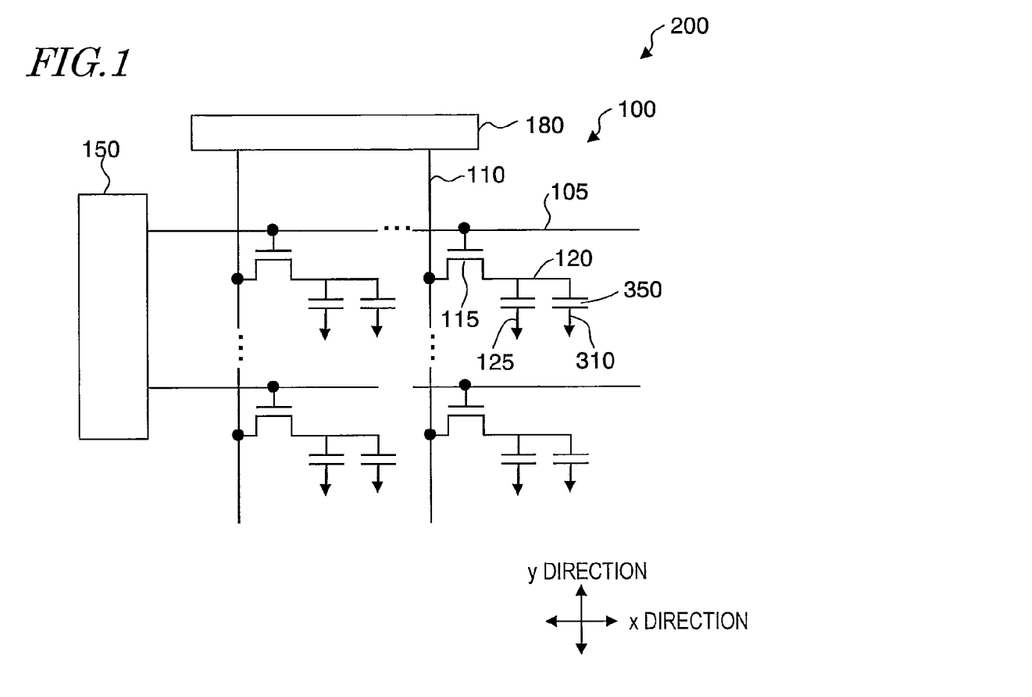
FIG. 1 An equivalent circuit diagram of a display device using a first embodiment of an active matrix substrate according to the present invention.

FIG. 1 shows an equivalent circuit of a display device 200 using an active matrix substrate 100 of the present embodiment. Herein, the display device 200 is a liquid crystal display device, and the display device 200 includes the active matrix substrate 100, a counter substrate (not shown) including a counter electrode 310, and a liquid crystal layer 350 placed between the counter substrate and the active matrix substrate 100.

The active matrix substrate 100 includes a gate bus line 105, a source bus line 110, a thin film transistor (TFT) 115, a pixel electrode 120, a storage capacitor line 125, a gate driver 150, and a source driver 180. There are a plurality of the pixel electrodes 120 arranged in a matrix pattern extending in the row direction (the x direction) and the column direction (the y direction), and the TFT 115 is provided for each pixel electrode. The TFTs 115 and the pixel electrodes 120 are provided in the display region, and the gate driver 150 and the source driver 180 are provided in the peripheral region. The gate bus line 105 and the storage capacitor line 125 extend in the row direction (the x direction), and the source bus line 110 extends in the column direction (the y direction) perpendicular to the row direction.

Figure 2:
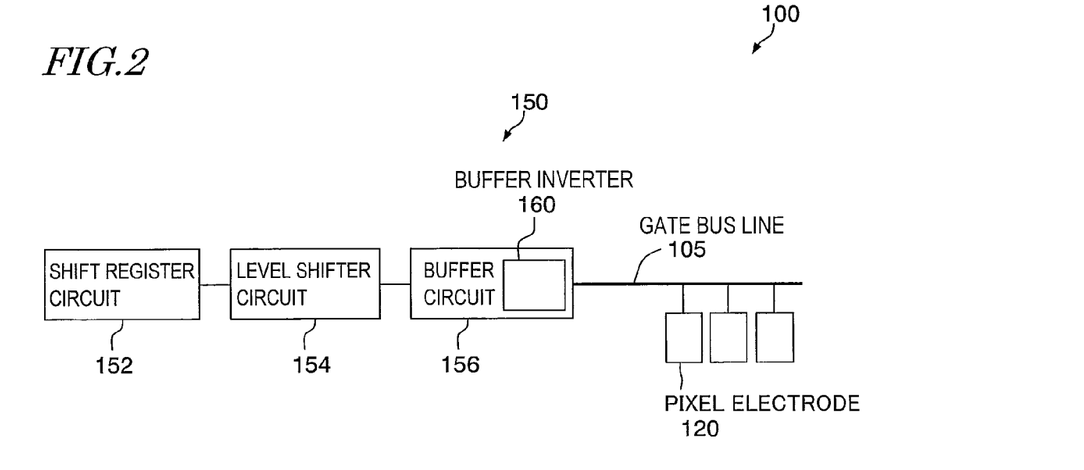
FIG. 2 A plan view showing the configuration of a gate driver and the vicinity thereof in the active matrix substrate of Embodiment 1.

FIG. 2 shows the configuration of the gate driver 150 and the vicinity thereof. The gate driver 150 includes a shift register circuit 152, a level shifter circuit 154, and a buffer circuit 156, and the buffer circuit 156 includes a buffer inverter 160 for each row of pixels. The buffer inverter 160 is placed in the vicinity of one end of the gate bus line 105.

Figure 3:
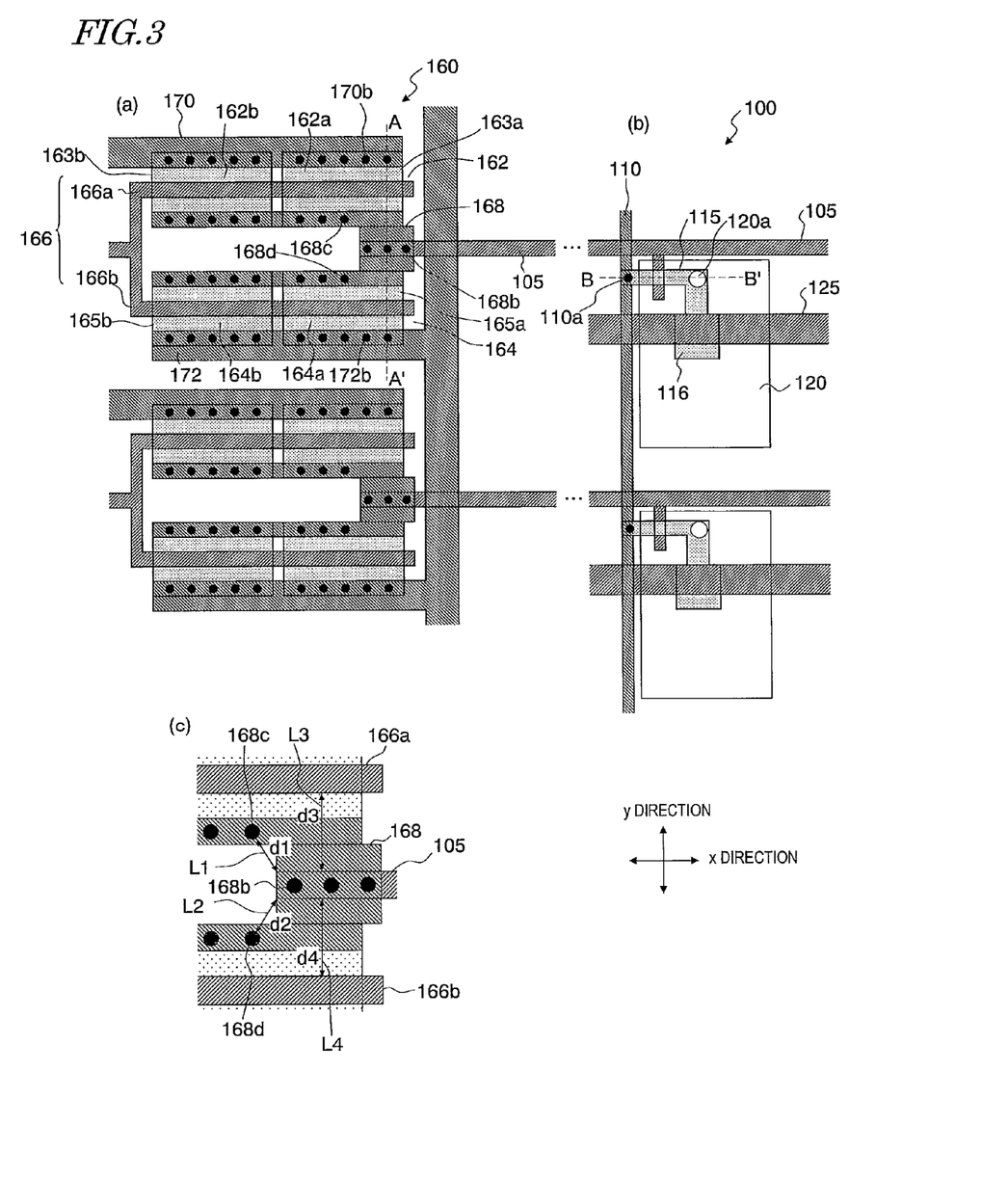
FIG. 3 A schematic diagram illustrating the configuration of the active matrix substrate of Embodiment 1, wherein (a) shows a plan view of the peripheral region, (b) shows a plan view of the display region, and (c) shows an enlarged view of (a).
Figure 4:
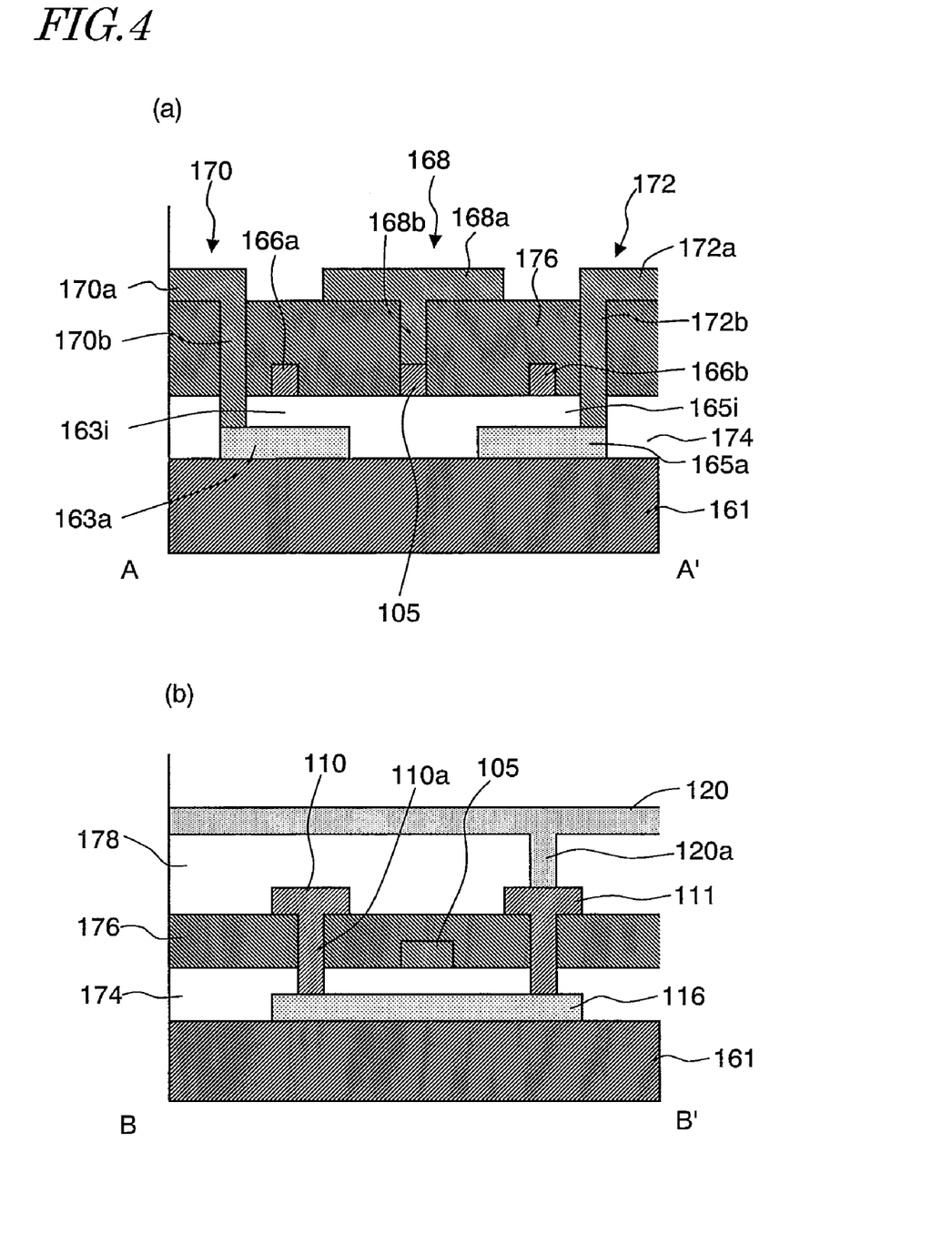

Referring now to FIGS. 3 and 4, the configuration of the active matrix substrate 100 of the present embodiment will be described. FIG. 3(a) shows a schematic plan view of the gate bus line 105 and the vicinity thereof in the peripheral region, FIG. 3(b) shows a schematic plan view of one pixel electrode 120 and the vicinity thereof in the display region, and FIG. 3(c) shows an enlarged view of a contact portion 168 shown in FIG. 3(a) and the vicinity thereof. FIG. 4(a) shows a cross-sectional view taken along line A-A' in FIG. 3(a), and FIG. 4(b) shows a cross-sectional view taken along line B-B' in FIG. 3(b).

As shown in FIG. 3(a), a Pch transistor section 162 includes two PMOS transistors 162a and 162b arranged in the row direction (the x direction), and an Nch transistor section 164 includes two NMOS transistors 164a and 164b arranged in the row direction. A gate electrode 166a is shared by the PMOS transistors 162a and 162b, and a gate electrode 166b is shared by the NMOS transistors 164a and 164b. The gate electrodes 166a and 166b are electrically connected to each other. Hereinafter, the gate electrodes 166a and 166b will be referred to collectively as a gate electrode 166. The gate electrode 166 extends in the x direction, together with the gate bus line 105.

The transistors 162a and 162b include semiconductor layers 163a and 163b, respectively, and the transistors 164a and 164b include the semiconductor layers 165a and 165b, respectively. The semiconductor layers 163a, 163b, 165a and 165b, which are separated from one another, each include a source region, a drain region, and a channel region located therebetween. Hereinafter, the semiconductor layers 163a and 163b of the Pch transistor section 162 will be referred to collectively as a semiconductor layer 163, and the semiconductor layers 165a and 165b of the Nch transistor section 164 as a semiconductor layer 165.

The contact portion 168 electrically connects the gate bus line 105 with the drain region of the PMOS transistors 162a and 162b and the drain region of the NMOS transistors 164a and 164b. The contact portion 168 includes a flat portion 168a provided on an interlayer film 176, gate bus line connecting portions 168b, Pch drain connecting portions 168c, and Nch drain connecting portions 168d. The connecting portions 168b, 168c and 168d electrically connect the gate bus line 105, the drain region of the semiconductor layer 163, and the drain region of the semiconductor layer 165, respectively, with the flat portion 168a.

A source contact portion 170 electrically connects the source regions of the PMOS transistors 162a and 162b with the high-voltage power supply, and a source contact portion 172 electrically connects the source regions of the NMOS transistors 164a and 164b with the low-voltage power supply. Hereinafter, the source contact portion 170 will be referred to also as a first source contact portion, and the source contact portion 172 as a second source contact portion. As shown in FIG. 4(a) the first source contact portion 170 includes a flat portion 170a provided on the interlayer film 176 and Pch source connecting portions 170b, and the second source contact portion 172 includes a flat portion 172a provided on the interlayer film 176 and Nch source connecting portions 172b, as does the contact portion 168. The connecting portions 170b and 172b electrically connect the source region of the semiconductor layer 163 and source region of the semiconductor layer 165 with the flat portions 170a and 172a, respectively. The connecting portions 168b are provided in contact holes formed in the interlayer film 176, and the connecting portions 168b, 168c, 168d, 170b and 172b are provided in contact holes formed in an insulating layer 174 and the interlayer film 176.

As shown in FIG. 3(c), in the active matrix substrate 100 of the present embodiment, the gate bus line 105 overlaps the gate electrode 166 in the x direction. In other words, the direction of the straight lines L3 and L4 denoting the shortest distances d3 and d4 between the gate electrode 166 and the gate bus line 105 is the y direction. The shortest distances d3 and d4 between the gate electrode 166 and the gate bus line 105 are 8 μm, for example.

As can be seen from FIGS. 3(a) and 4(a), in the active matrix substrate 100 of the present embodiment, the Pch drain connecting portions 168c are absent in a portion of the drain region of the semiconductor layer 163a that is closer to the display region, and the direction of the straight line L1 denoting the shortest distance d1 between one of the Pch drain connecting portions 168c that is closest to the gate bus line 105 and the gate bus line 105 is inclined with respect to the y direction. Herein, the shortest distance between the Pch drain connecting portion 168c and the gate bus line 105 does not refer to that along a perpendicular line extending in the y direction between a straight line being the virtual extension of the gate bus line 105 extending in the x direction and the Pch drain connecting portion 168c, but refers to that between the actual gate bus line 105 itself and the Pch drain connecting portion 168c. Thus, the shortest distance d1 between the Pch drain connecting portion 168c closest to the gate bus line 105 and the gate bus line 105 is longer than that in the conventional active matrix substrate 800 shown in FIG. 8, and is 7 μm, for example. As described above, since the shortest distance d1 between the contact hole for be the Pch drain connecting portion 168c and the gate bus line 105 is relatively long, an electrostatic discharge is prevented and the breaking of a gate insulating film 163i is suppressed, even if contact holes for the Pch drain connecting portions 168c are formed in the interlayer film 176. Similarly, the direction of the straight line L2 denoting the shortest distance d2 between one of the Nch drain connecting portions 168d that is closest to the gate bus line 105 and the gate bus line 105 is also inclined with respect to the y direction, thereby suppressing the breaking of a gate insulating film 165i.

As shown in FIG. 3(c), in the active matrix substrate 100 of the present embodiment, the drain connecting portions 168c and 168d are absent on the straight lines L3 and L4 denoting the shortest distances d3 and d4 between the gate electrodes 166a and 166b and the gate bus line 105, and therefore the drain connecting portions 168c and 168d are asymmetric with the source connecting portions 170b and 172b with respect to the gate electrodes 166a and 166b, respectively. As can be seen from a comparison between FIG. 3(a) and FIG. 8(a), in the active matrix substrate 100 of the present embodiment, the number of the drain connecting portions 168c and 168d is smaller than that of the active matrix substrate 800, thus increasing the contact resistance between the drain regions of the semiconductor layers 163 and 165 and the drain connecting portions 168c and 168d, respectively. However, since they are in contact with each other via the plurality of the drain connecting portions 168c and 168d, the increase in the contact resistance does not substantially influence the signal transmission.

As shown in FIG. 3(a), the drain region of the PMOS transistors 162a and 162b and the drain region of the NMOS transistors 164a and 164b are electrically connected to the gate bus line 105 by a single contact portion 168, and it is therefore possible to reduce the width of the buffer inverter 160 in the y direction. The contact portions 168, 170 and 172 are in contact with the semiconductor layers 163 and 165 and the gate bus line 105 via the connecting portions 168b, 168c, 168d, 170b and 172b, which are separated from one another. By thus connecting two members together via a plurality of connecting portions, connection failure is suppressed even when the connection is insufficient at one connecting portion. In the active matrix substrate 100 of the present embodiment, the gate electrode 166 is provided above the semiconductor layers 163 and 165. Therefore, the active matrix substrate 100 has a top-gate structure.

As shown in FIG. 3(b), a portion of a semiconductor layer 116 is used in the TFT 115. The source region of the semiconductor layer 116 is electrically connected to the source bus line 110 via a connecting portion 110a, and the drain region of the semiconductor layer 116 is electrically connected to the pixel electrode 120 via a connecting portion 111 (see FIG. 4(b)) and a connecting portion 120a. A portion of the gate bus line 105 extends in the y direction and overlaps the channel region of the semiconductor layer 116 located between the source region and the drain region thereof, thus serving as the gate electrode of the TFT 115. The storage capacitor line 125 is provided so as to overlap another portion of the semiconductor layer 116.

As shown in FIG. 4(a), the PMOS transistor 162a includes the gate insulating film 163i provided between the channel region of the semiconductor layer 163a and the gate electrode 166a, and the NMOS transistor 164a similarly includes the gate insulating film 165i provided between the channel region of the semiconductor layer 165a and the gate electrode 166b. These gate insulating films 163i and 165i are portions of the insulating layer 174.

As shown in FIG. 4(b), in the display region, the source bus line 110 is electrically connected to the semiconductor layer 116 via the connecting portion 110a, and the pixel electrode 120 is electrically connected to the semiconductor layer 116 via the connecting portion 120a provided in the contact hole in an interlayer film 178 and the connecting portion 111 provided in the contact hole in the interlayer film 176. Hereinafter, the interlayer film 176 may be referred to as a first interlayer film, and the interlayer film 178 as a second interlayer film.

The active matrix substrate 100 of the present embodiment is produced as follows.

First, a base coat film (not shown) is formed on the principal plane of an insulative substrate 161. The insulative substrate 161 may be a glass substrate, for example. The base coat film may be an $SiO_2$ film, an SiNx film, or a laminate of these films.

Then, an amorphous silicon (a-Si) film having a thickness of 50 nm is formed on the base coat film. The a-Si film may be formed by, for example, a PCVD (Plasma Chemical Vapor Deposition) method, or the like. Alternatively, the a-Si film may be formed by another method. Then, the a-Si film is crystallized to form a polysilicon (poly-Si) film. The crystallization of the a-Si film can be done by optical irradiation using an excimer laser (excimer laser annealing), or by subjecting the a-Si film to a heat treatment at 600° C. (solid-phase crystallization). Then, a resist layer is formed on the polysilicon film, and dry etching is performed using the resist layer as a patterning mask to pattern the polysilicon film. Thus, the island-like semiconductor layers 163 and 165 are formed.

Then, the insulating layer 174 covering the semiconductor layers 163 and 165 is formed. The insulating layer 174 is formed by depositing $SiO_2$ to a thickness of 80 nm, for example, by a CVD method. Portions of the insulating layer 174 become the gate insulating films of the transistor 115, 162a, 162b, 164a and 164b.

Then, a conductive material is deposited on the insulating layer 174 using a sputtering method, a CVD method, or the like, and is patterned into a predetermined shape, thus forming the gate bus line 105, the storage capacitor line 125 and the gate electrode 166. As described above, the gate bus line 105, the storage capacitor line 125 and the gate electrode 166 are produced in the same step. The layer forming the gate bus line 105, the storage capacitor line 125 and the gate electrode 166 as described above will be referred to as a gate electrode layer. The conductive material of the gate electrode layer is preferably a metal such as tantalum or tungsten, for example.

Then, the semiconductor layers 163 and 165 are implanted with impurity ions using the gate electrodes 166a and 166b as a mask, followed by an annealing for activation, thus forming the source region and the drain region for each of the semiconductor layers 163 and 165. Thus, portions of the semiconductor layers 163 and 165 between the source region and the drain region become channel regions.

Then, after the first interlayer film 176 is formed so as to cover the substrate surface, there are formed contact holes running through the first interlayer film 176 and the insulating layer 174 to reach the source regions and the drain regions of the semiconductor layers 163 and 165, and other contact holes running through the first interlayer film 176 to reach the gate bus line 105. In the conventional active matrix substrate 800 described above, since the distance between the contact holes for the drain connecting portions 868c and 868d and the gate bus line 805 is short, the formation of contact holes in the interlayer film 876 may cause an electrostatic discharge to break the gate insulating film. In the active matrix substrate 100 of the present embodiment, since the distance between the contact holes for the drain connecting portions 168c and 168d and the gate bus line 105 is relatively long, the occurrence of an electrostatic discharge is suppressed even when contact holes are formed in the interlayer film 176.

Then, a conductive material is deposited in the contact holes in the first interlayer film 176 and on the first interlayer film 176, and is patterned into a predetermined shape, thus forming the contact portions 168, 170 and 172 and the source bus line 110. Portions of the contact portion 168 become the drain electrodes of the Pch transistor section 162 and the Nch transistor section 164, and portions of the contact portions 170 and 172 become the source electrodes of the Pch transistor section 162 and the Nch transistor section 164. As described above, the contact portions 168, 170 and 172 and the source bus line 110 are produced in the same step. The layer forming the contact portions 168, 170 and 172 and the source bus line 110 as described above will be referred to as a source electrode layer. The conductive material of the source electrode layer is preferably a metal compound containing aluminum, or the like, for example. As described above, the transistors 162a, 162b, 164a and 164b are produced in the peripheral region. As are these transistors, the TFTs 115 are produced in the display region.

Then, a passivation film covering the TFTs 115 is formed in the display region, and contact holes are formed therein. Thus, the second interlayer film 178 is formed. Then, ITO is deposited in the contact holes in the second interlayer film 178 and on the second interlayer film 178, and is patterned into a predetermined shape to form a pixel electrode connected to the drain region of the semiconductor layer 116. The active matrix substrate 100 can be produced as described above.

The active matrix substrate 100 of the present embodiment can be produced only by making changes as to where contact holes are formed to the production process of the conventional active matrix substrate 800 shown in FIG. 8. Therefore, it is possible to suppress the occurrence of a line failure without making substantial changes to the existing apparatuses.

While the Pch transistor section 162 and the Nch transistor section 164 in the buffer inverter 160 shown in FIG. 3(a) each include two transistors, the present invention is not limited to this. The Pch transistor section 162 and the Nch transistor section 164 may each include three or more transistors.

In the above description, the direction of the straight lines L1 and L2 denoting the shortest distances d1 and d2 between the gate bus line 105 and those of the drain connecting portions 168c and 168d in the Pch transistor section 162 and the Nch transistor section 164 that are closest to the gate bus line 105 is inclined with respect to the y direction. However, the present invention is not limited to this. The direction of the straight line denoting the shortest distance between the drain connecting portion and the gate bus line 105 may be inclined with respect to the y direction only in one of the Pch transistor section 162 and the Nch transistor section 164.

While the drain connecting portions 168c and 168d are asymmetric with the source connecting portions 170b and 172b with respect to the gate electrodes 166a and 166b, respectively, in the above description, the present invention is not limited to this. The source connecting portions 170b and 172b may be absent in portions of the source regions of the semiconductor layers 163a and 165b that are closer to the display region, so that the drain connecting portions 168c and 168d and the source connecting portions 170b and 172b are provided symmetrically with each other with respect to the gate electrodes 166a and 166b, respectively.

Embodiment 2

In the active matrix substrate of Embodiment 1, the gate bus line 105 overlaps the gate electrode 166 in the x direction, and the direction of the straight lines L3 and L4 denoting the shortest distances d3 and d4 between the gate electrode 166 and the gate bus line 105 is the y direction. However, the present invention is not limited to this.

Figure 5:
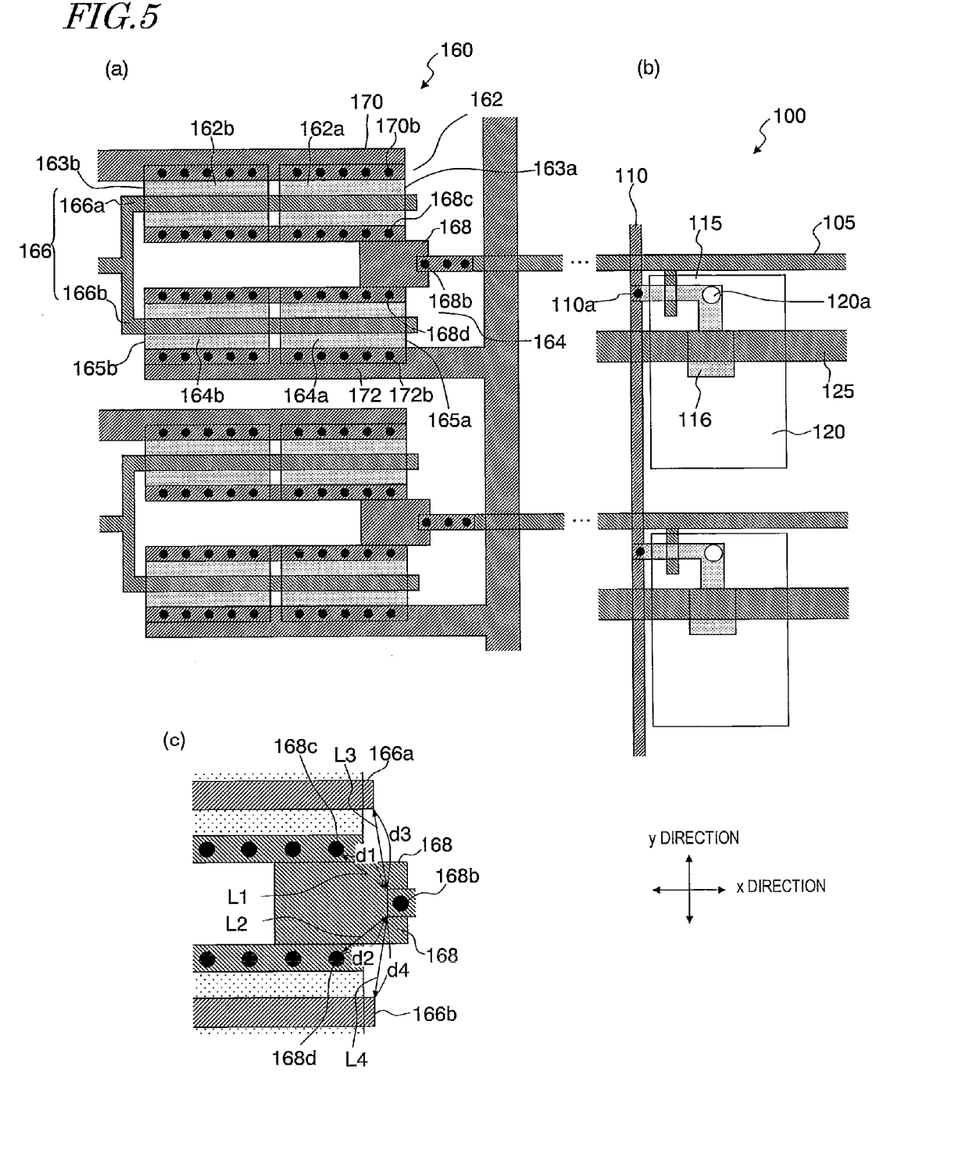
FIG. 5 A schematic diagram illustrating a second embodiment of an active matrix substrate according to the present invention, wherein (a) shows a plan view of the peripheral region, (b) shows a plan view of the display region, and (c) shows an enlarged view of (a).

Referring now to FIG. 5, a second embodiment of an active matrix substrate according to the present invention will be described. FIG. 5(a) shows a schematic plan view of the gate bus line 105 and the vicinity thereof in the peripheral region of the active matrix substrate 100 of the present embodiment, FIG. 5(b) shows a schematic plan view of one pixel electrode 120 and the vicinity thereof in the display region, and FIG. 5(c) shows an enlarged view of the contact portion 168 shown in FIG. 5(a) and the vicinity thereof. The active matrix substrate 100 of the present embodiment has substantially the similar configuration as that of the active matrix substrate of Embodiment 1 described above with reference to FIGS. 1, 2 and 4, except that the gate bus line 105 does not overlap the gate electrode 166 in the x direction. Therefore, what are common between these embodiments will not be described in order to avoid redundancy.

In the active matrix substrate of Embodiment 1, the direction of the straight lines L3 and L4 denoting the shortest distances d3 and d4 between the gate electrode 166 and the gate bus line 105 is the y direction, as shown in FIG. 3(c). In the active matrix substrate 100 of the present embodiment, the direction of the straight lines L3 and L4 denoting the shortest distances d3 and d4 between the gate electrode 166 and the gate bus line 105 is inclined with respect to the y direction, as shown in FIG. 5(c).

Moreover, as shown in FIGS. 5(a) and 5(c), in the active matrix substrate 100, the drain connecting portions 168c and 168d are provided also in portions of the drain regions of the semiconductor layers 163a and 165a that are closer to the display region, and the drain connecting portions 168c and 168d are symmetric with the source connecting portions 170b and 172b with respect to the gate electrodes 166a and 166b, respectively, as opposed to the active matrix substrate of Embodiment 1 shown in FIG. 3(a). However, as shown in FIG. 5(c), since the gate bus line 105 does not overlap the gate electrode 166 in the x direction, the direction of the straight line L1 denoting the shortest distance d1 between one of the drain connecting portions 168c that is closest to the gate bus line 105 and the gate bus line 105 is inclined with respect to the y direction, and similarly, the direction of the straight line L2 denoting the shortest distance d2 between one of the drain connecting portions 168d that is closest to the gate bus line 105 and the gate bus line 105 is inclined with respect to the y direction.

Therefore, even though the distance between the gate electrode 166 and the gate bus line 105 is short, the distance between the contact holes for the drain connecting portions 168c and 168d and the gate bus line 105 is relatively long, as described above. Thus, it is possible to suppress the breaking of the gate insulating film due to a charge stored in the gate bus line 105.

While the TFT 115, the PMOS transistors 162a and 162b and the NMOS transistors 164a and 164b have a top-gate structure in the above description, the present invention is not limited to this. They may have a bottom-gate structure.

While the display device is a liquid crystal display device, and a liquid crystal layer is used as the display medium layer in the above description, the present invention is not limited to this. The display device may be any type of a display device, such as an organic EL display device, a plasma display device, or an SED display device. Where the display device is an organic EL display device, the display device does not need to include a counter substrate, and the display medium layer, i.e., an organic EL layer, may be provided on the active matrix substrate.

INDUSTRIAL APPLICABILITY

According to the present invention, it is possible to provide an active matrix substrate suitable for use in a display device, particularly a liquid crystal display device. The active matrix substrate is suitably used in a small-size display device such as a display section of a portable telephone, and is capable of suppressing the occurrence of a line defect.

The invention claimed is:

1. An active matrix substrate comprising:
a gate bus line;
a buffer inverter including a first-conductivity-type transistor section and a second-conductivity-type transistor section, wherein each of the first-conductivity-type transistor section and the second-conductivity-type transistor section includes a semiconductor layer and a gate electrode, the semiconductor layer including a source region, a drain region and a channel region;
an interlayer film covering the gate bus line and the gate electrode; and
a contact portion for electrically connecting the drain regions of the first-conductivity-type transistor section and the second-conductivity-type transistor section with the gate bus line, wherein
the gate bus line and the gate electrode extend in a first direction,
the first-conductivity-type transistor section includes a plurality of first-conductivity-type transistors arranged in the first direction,
the second-conductivity-type transistor section includes a plurality of second-conductivity-type transistors arranged in the first direction,
the contact portion includes a flat portion provided on the interlayer film, a plurality of gate bus line connecting portions each electrically connecting the flat portion with the gate bus line, a plurality of first-conductivity-type drain connecting portions each electrically connecting the flat portion with the drain region of the first-conductivity-type transistor section, and a plurality of second-conductivity-type drain connecting portions each electrically connecting the flat portion with the drain region of the second-conductivity-type transistor section, and a direction of a straight line denoting a shortest distance between one of the plurality of first-conductivity-type drain connecting portions that is closest to the gate bus line and the gate bus line is inclined with respect to a second direction perpendicular to the first direction.

2. The active matrix substrate of claim 1, further comprising: an insulating layer including a gate insulating film provided between the channel region of the semiconductor layer and the gate electrode, wherein the gate bus line and the gate electrode are provided on the insulating layer.

3. The active matrix substrate of claim 2, wherein the plurality of gate bus line connecting portions are provided in a plurality of contact holes fanned in the interlayer film; and the plurality of first-conductivity-type drain connecting portions are provided in a plurality of contact holes foamed in the interlayer film and the insulating layer.

4. The active matrix substrate of claim 1, wherein a shortest distance between one of the plurality of first-conductivity-type drain connecting portions that is closest to the gate bus line and the gate bus line is 7 μm.

5. The active matrix substrate of claim 1, wherein a direction of a straight line denoting a shortest distance between one of the plurality of second-conductivity-type drain connecting portions that is closest to the gate bus line and the gate bus line is inclined with respect to the second direction.

6. The active matrix substrate of claim 1, further comprising:

a first source contact portion in contact with the source region of the first-conductivity-type transistor section; and a second source contact portion in contact with the source region of the second-conductivity-type transistor section.

7. The active matrix substrate of claim 6, wherein the first source contact portion and the second source contact portion are produced from a same material as the contact portion.

8. The active matrix substrate of claim 6, wherein the first source contact portion includes a flat portion provided on the interlayer film, and a plurality of first-conductivity-type source connecting portions each electrically connecting the flat portion with the source region of the first-conductivity-type transistor section.

9. The active matrix substrate of claim 8, wherein the plurality of first-conductivity-type drain connecting portions and the plurality of first-conductivity-type source connecting portions are provided symmetrically with each other with respect to a gate electrode of the first-conductivity-type transistor.

10. The active matrix substrate of claim 1, wherein a direction of a straight line denoting a shortest distance between the gate electrode and the gate bus line is the second direction.

11. The active matrix substrate of claim 8, wherein the plurality of first-conductivity-type drain connecting portions and the plurality of first-conductivity-type source connecting portions are provided asymmetrically with each other with respect to a gate electrode of the first-conductivity-type transistor.

12. The active matrix substrate of claim 1, wherein a direction of a straight line denoting a shortest distance between the gate electrode and the gate bus line is inclined with respect to the second direction.

13. A display device, comprising:

the active matrix substrate of claim 1; and a display medium layer provided on the active matrix substrate.

14. A method for manufacturing an active matrix substrate, comprising the steps of:

forming a semiconductor layer for a first-conductivity-type transistor section including a plurality of first-conductivity-type transistors arranged in a first direction and a semiconductor layer for a second-conductivity-type transistor section including a plurality of second-conductivity-type transistors arranged in the first direction, wherein the first-conductivity-type transistor section and the second-conductivity-type transistor section are included in a buffer inverter, and each of the semiconductor layers includes a source region, a channel region and a drain region;

forming a gate bus line and a gate electrode of the first-conductivity-type transistor section and the second-conductivity-type transistor section, wherein the gate bus line and the gate electrode extend in the first direction;

forming an interlayer film covering the gate bus line and the gate electrode; and forming a contact portion for electrically connecting the drain regions of the first-conductivity-type transistor section and the second-conductivity-type transistor section with the gate bus line, wherein the contact portion includes a flat portion provided on the interlayer film, a plurality of gate bus line connecting portions each electrically connecting the flat portion with the gate bus line, a plurality of first-conductivity-type drain connecting portions each electrically connecting the flat portion with the drain region of the first-conductivity-type transistor section, and a plurality of second-conductivity-type drain connecting portions each electrically connecting the flat portion with the drain region of the second-conductivity-type transistor section, wherein in the step of forming the contact portion, a direction of a straight line denoting a shortest distance between one of the plurality of first-conductivity-type drain connecting portions that is closest to the gate bus line and the gate bus line is inclined with respect to a second direction perpendicular to the first direction.

15. The method for manufacturing an active matrix substrate of claim 14, further comprising the step of:

forming, in the interlayer film, a plurality of contact holes for the plurality of first-conductivity-type drain connecting portions, wherein in the step of forming the plurality of contact holes, a direction of a straight line denoting a shortest distance between one of the plurality of contact holes for the plurality of first-conductivity-type drain connecting portions that is closest to the gate bus line and the gate bus line is inclined with respect to the second direction.

* * * * *